(12) United States Patent
Kim et al.

(10) Patent No.: US 8,859,331 B2
(45) Date of Patent: Oct. 14, 2014

(54) COMPOSITIONS USED IN FORMATION OF OXIDE MATERIAL LAYERS, METHODS OF FORMING AN OXIDE MATERIAL LAYER USING THE SAME, AND METHODS OF FABRICATING A THIN FILM TRANSISTOR USING SAME

(75) Inventors: Hyun Jae Kim, Seoul (KR); Dong Lim Kim, Seoul (KR); Joohye Jung, Seoul (KR); You Seung Rim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 106 days.

(21) Appl. No.: 13/523,978

(22) Filed: Jun. 15, 2012

(65) Prior Publication Data

US 2013/0059414 A1 Mar. 7, 2013

(30) Foreign Application Priority Data

Sep. 2, 2011 (KR) .................. 10-2011-0089180

(51) Int. Cl.
*H01L 21/00* (2006.01)
*H01L 21/16* (2006.01)
*H01L 21/02* (2006.01)

(52) U.S. Cl.
CPC ............ *H01L 1/08* (2013.01); *H01L 21/02628* (2013.01); *H01L 21/02565* (2013.01); *H01L 21/02488* (2013.01); *H01L 21/02554* (2013.01)
USPC ........... 438/104; 438/106; 438/378; 438/513; 257/E21.006; 257/E21.077; 257/E21.17; 257/E21.311; 257/E21.329; 257/E21.331; 257/E21.347; 257/E21.632

(58) Field of Classification Search
USPC ........... 438/104, 99, 106, 149, 142, 160, 378, 438/509, 513; 257/E21.006, E21.077, 257/E21.17, E21.311, E21.329, E21.331, 257/E21.347, E21.632
See application file for complete search history.

(56) References Cited

U.S. PATENT DOCUMENTS

| 4,882,014 | A | * | 11/1989 | Coyle et al. .................. 205/45 |
| 5,364,522 | A | * | 11/1994 | Wang ........................... 205/50 |
| 7,947,537 | B2 | * | 5/2011 | Honda et al. ................ 438/142 |
| 2009/0173938 | A1 | | 7/2009 | Honda et al. |

FOREIGN PATENT DOCUMENTS

| KR | 10-2009-0052228 A | 5/2009 |
| KR | 10-2010-0013554 A | 2/2010 |
| KR | 10-2010-0095328 A | 8/2010 |
| KR | 10-2010-0120939 A | 11/2010 |

OTHER PUBLICATIONS

R.S. Sonawane et al., "Preparation of titanium(IV) oxide thin film photocatalyst by sol-gel dip coating", Materials Chemistry and Physics 77, Issue 3, pp. 744-750, 2002.
Kai Jiang, "New Luminescent Materials and High-Performance Solution-Processed Oxide Thin Films", Oregon Sate University, PhD degree graduation thesis, Jun. 2010.

* cited by examiner

*Primary Examiner* — David Nhu
(74) *Attorney, Agent, or Firm* — Carter, DeLuca, Farrell & Schmidt, LLP (57) ABSTRACT

Methods of forming an oxide material layer are provided. The method includes mixing a precursor material with a peroxide material to form a precursor solution, coating the precursor solution on a substrate, and baking the coated precursor solution.

15 Claims, 7 Drawing Sheets

COMPOSITIONS USED IN FORMATION OF OXIDE MATERIAL LAYERS, METHODS OF FORMING AN OXIDE MATERIAL LAYER USING THE SAME, AND METHODS OF FABRICATING A THIN FILM TRANSISTOR USING SAME

CROSS-REFERENCE TO RELATED APPLICATIONS

This U.S. non-provisional patent application claims priority under 35 U.S.C. §119 to Korean Patent Application No. 10-2011-0089180, filed on Sep. 2, 2011, the entirety of which is hereby incorporated by reference herein.

BACKGROUND

The inventive concepts disclosed herein relate to compositions and methods of forming a semiconductor device using the same and, more particularly, to compositions used in formation of oxide material layers, methods of forming an oxide material layer using the same and methods of fabricating a thin film transistor using the same.

Recently, display units have been developed to have the wider size, the ultra high definition and the faster operation. Some of the display units may employ thin film transistors as driving devices for pixels. The thin film transistors may be fabricated using an amorphous silicon layer as an active layer. Unfortunately, the amorphous silicon layer may exhibit a relatively low carrier mobility of about 0.5 $cm^2/Vs$. Thus, there may be limitations in realizing a high performance thin film transistors using the amorphous silicon layer. Accordingly, oxide semiconductor materials may be very attractive as candidates of base materials for improving the performance of the thin film transistors. This is because the oxide semiconductor materials have an amorphous crystalline structure and exhibit a relatively high carrier mobility of about 5 $cm^2/Vs$ to about 10 $cm^2/Vs$. The oxide semiconductor materials may be deposited using a sputtering process or a plasma enhanced chemical vapor deposition (PECVD) process. However, the sputtering process or the PECVD process may require a high vacuum environment to produce a high quality of the oxide semiconductor films. That is, high priced equipment or apparatuses may be required to form the oxide semiconductor films. Thus, the costs of fabricating high performance thin film transistors may be relatively high. To solve these disadvantages, a solution process, for example, a spin coating process, an inkjet process or the like has been proposed.

However, in the event that the solution process is used in deposition of the oxide semiconductor film, it may be difficult to control an oxygen concentration in the oxide semiconductor film and a relatively high temperature process may be required to deposit the oxide semiconductor film as compared with the vacuum deposition process (e.g., the sputtering process or the PECVD process). Accordingly, methods of forming the oxide semiconductor film by using a catalyst or by controlling ligands combined with metal precursors have been developed to solve the above disadvantages. However, the methods of forming the oxide semiconductor film using a catalyst may require additional impurities. Thus, a quality of the oxide semiconductor film may be degraded. Further, the method of forming the oxide semiconductor film by controlling ligands combined with metal precursors may be restrictively used according to reactivity of the metal precursors.

SUMMARY

Exemplary embodiments of the inventive concept are directed to compositions used in formation of an oxide material layer, methods of forming an oxide material layer using the same, and methods of fabricating a thin film transistor using the same.

According to some embodiments, a composition used in formation of an oxide semiconductor layer includes a precursor material and a peroxide material.

The peroxide material may include at least one among hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP).

A weight ratio of the precursor material to the peroxide material may be 1:0.1 to 1:3.

According to some embodiments, a method of forming an oxide semiconductor layer includes the steps of (a) mixing a precursor material with a peroxide material to form a precursor solution, (b) coating the precursor solution on a substrate, and (c) baking the coated precursor solution.

The step (c) may include the steps of (d) soft baking the substrate to remove solvent in the coated precursor solution after the step (b), and (e) hard baking the substrate after the step (d) to form an oxide material layer.

The method may further include the step of supplying photo energy to the substrate after at least one step among the steps (a), (b), (d) and (e).

The step of supplying the photo energy may be repeatedly performed two or more times.

The step of supplying photo energy may be performed for 10 minutes to 10 hours.

The step of supplying photo energy may include irradiating a light having energy that is higher than bonding energy of the precursor material.

The step of supplying photo energy may include irradiating a light having an intensity of about 2 $mW/cm^2$ to about 20 $mW/cm^2$.

The peroxide material may include at least one among hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP).

The precursor material may be formed by combining at least one of predetermined metal group with at least one among citrate, acetate, acetylacetonate, acrylate, chloride, nitrate, fluoride, methoxide, ethoxide, propoxide and butoxide, and the predetermined metal group may include tin (Sn), zinc (Zn), indium (In), gallium (Ga), thallium (Tl), zirconium (Zr), yttrium (Y), hafnium (Hf), aluminum (Al), magnesium (Mg) and nickel (Ni).

The precursor material and the peroxide material may be mixed in a weight ratio of 1:0.1 to 1:3.

According to some embodiments, a method of forming an oxide semiconductor layer includes the steps of (a) forming a precursor solution, (b) coating the precursor solution on a substrate, (d) soft baking the substrate to remove solvent in the coated precursor solution, (e) hard baking the substrate after the step (d) to form an oxide material layer, and (f) supplying photo energy to the substrate after at least one step among the steps (a), (b), (d) and (e).

According to some embodiments, a method of forming an oxide semiconductor layer includes coating a precursor solution on a substrate, and supplying photo energy to the substrate on which the precursor solution is coated. The precursor solution is formed by mixing a precursor material with a peroxide material.

According to some embodiments, a method of fabricating a thin film transistor includes mixing a precursor material with a peroxide material to form a precursor solution, and forming at least one of a gate electrode, a gate insulation layer, a channel layer and source/drain electrodes on a substrate using the precursor solution.

Forming the at least one of the gate electrode, the gate insulation layer, the channel layer and the source/drain electrodes may include supplying photo energy to the substrate.

The peroxide material may include at least one among hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP).

The precursor material and the peroxide material may be mixed in a weight ratio of 1:0.1 to 1:3, respectively.

The photo energy may be higher than bonding energy of the precursor material.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

The exemplary embodiments of the inventive concept will now be described more fully hereinafter with reference to the accompanying drawings. It should be noted, however, that the inventive concept is not limited to the following exemplary embodiments, and may be implemented in various different forms. Rather, these embodiments are provided so that this disclosure will be thorough and complete, and will fully convey the scope of the inventive concept to those skilled in the art. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

It will be understood that when an element such as a layer, region or substrate is referred to as being "on" or "connected (or coupled) to" another element, it can be directly on or connected (or coupled) to the other element or intervening elements may be present. In contrast, the terms "directly on," "directly connected," or "directly coupled" mean that there are no intervening elements. Similarly, it will be understood that when an element such as a layer, region or substrate is referred to as being "between" two different elements, it can be directly interposed between the two different elements without any intervening element or intervening elements may be present therebetween. In contrast, the term "directly between" means that there are no intervening elements.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an etched region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Methods of forming oxide material layers according to the exemplary embodiments may be performed using a solution based process. According to the solution based process, the oxide material layer can be more readily formed on a substrate having a large area. Further, according to the solution based process, the oxide material layer can be more readily formed on a flexible substrate. The methods of forming the oxide material layers according to the exemplary embodiments may be performed using a sol-gel process. That is, the oxide material layer according to an exemplary embodiment may be formed by coating a precursor solution on a substrate with a spin coating process and curing the coated precursor solution with a baking process. However, the exemplary embodiments may be embodied and/or modified in many different forms.

Figure 1:
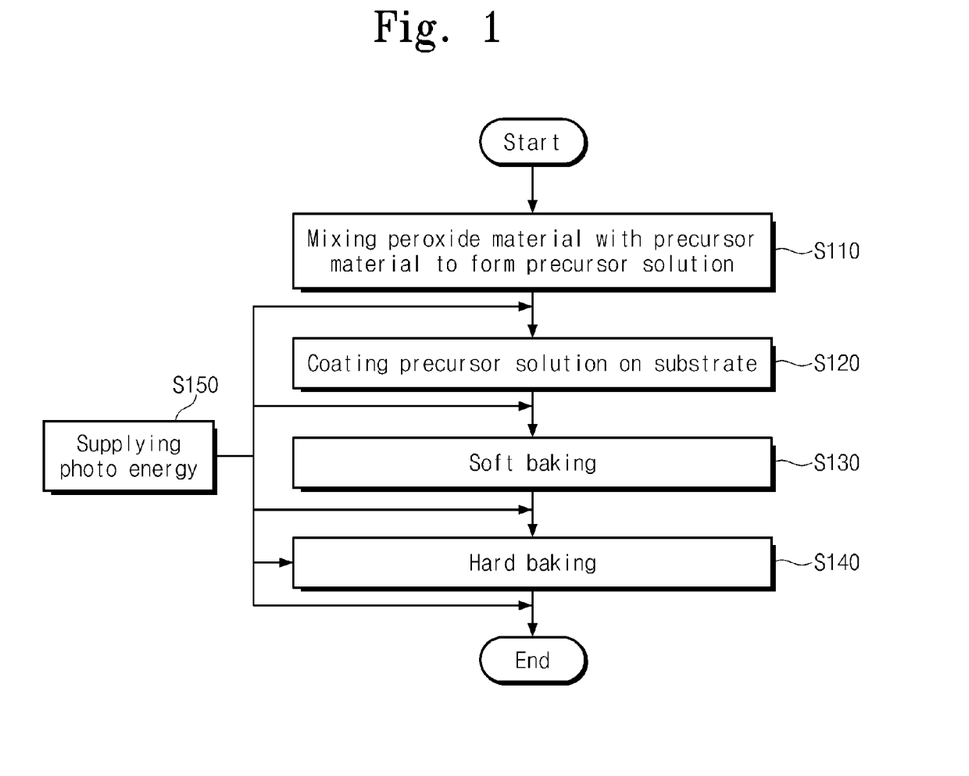
FIG. 1 is a process flow chart illustrating a method of forming an oxide material layer according to an exemplary embodiment.
Figure 2:
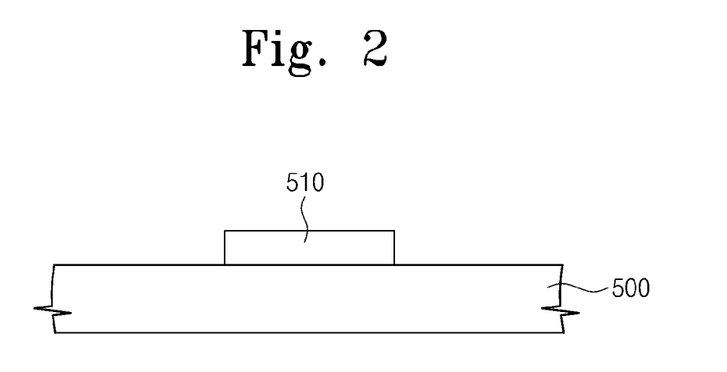
FIGS. 2 to 5 are cross sectional views illustrating a method of fabricating an inverted staggered type thin film transistor according to an exemplary embodiment.
Figure 3:
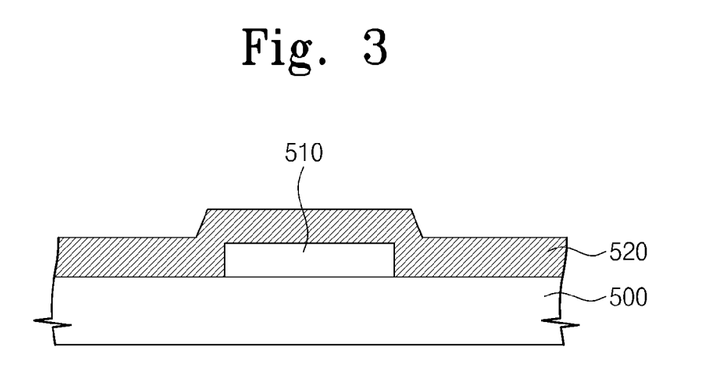
Figure 4:
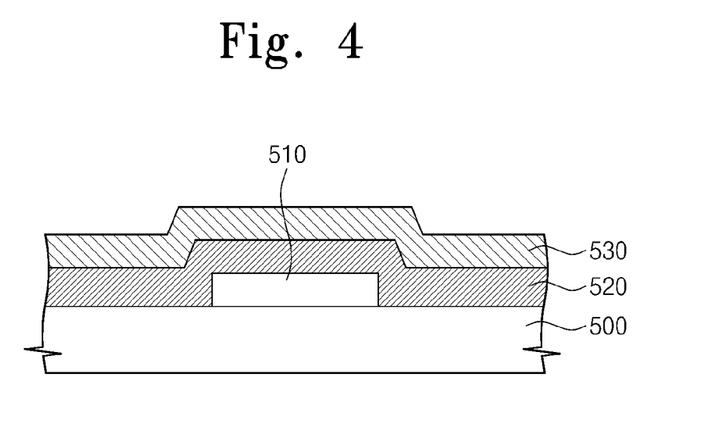
Figure 5:
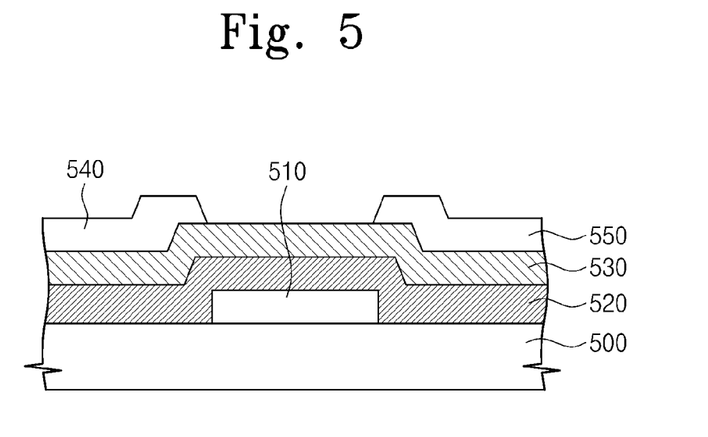

FIG. 1 is a process flow chart illustrating a method of forming an oxide material layer according to an exemplary embodiment.

As illustrated in FIG. 1, a method of forming an oxide material layer according to an exemplary embodiment may include steps of mixing a precursor material with a peroxide material to form a precursor solution (S110), coating the precursor solution on a substrate (S120), soft baking the substrate to remove solvent in the coated precursor solution (S130), hard baking the substrate to form an oxide material layer (S140) and supplying photo energy (S150).

First, the step of forming the precursor solution (S110) will be described hereinafter. The precursor solution may be fabricated by mixing a precursor material with a peroxide material as listed in the above as an exemplary way.

The precursor material may be formed by combining at least one among tin (Sn), zinc (Zn), indium (In), gallium (Ga), thallium (Tl), zirconium (Zr), yttrium (Y), hafnium (Hf), aluminum (Al), magnesium (Mg) and nickel (Ni) with at least one among citrate, acetate, acetylacetonate, acrylate, chloride, nitrate, fluoride, methoxide, ethoxide, propoxide and butoxide.

The peroxide material may include at least one among hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP). The peroxide material may be appropriately selected according to a solvent or a stabilizer used in formation of the precursor solution. Preferably, the peroxide material may be a material that can be uniformly dissolved in the solvent.

The precursor material and the peroxide material may be mixed in a weight ratio of 1:0.1 to 1:3. For example, when a content of the precursor material is within the range of about 0.2 grams to about 0.5 grams in the precursor solution, a weight of the peroxide material may be about 0.02 grams to about 1.5 grams. Further, a volume ratio of the peroxide material to the solvent is about 1:20 to about 1:2. A property or a characteristic of the oxide material layer may depend on the concentrations of the precursor material and the peroxide material included in the precursor solution. That is, the concentrations of the precursor material and the peroxide material may be determined according to use or application of the oxide material layer. For example, the oxide material layer may be conductive layer, insulating layer or semi-conductive layer depending on the concentrations of the precursor material and the peroxide material. The sort of the precursor materials selected also may change the property or characteristics of the oxide material layer.

Next, the step of coating the precursor solution on the substrate (S120) will be described hereinafter. The substrate may be formed of glass, plastic, silicon or synthetic resin. In an exemplary embodiment, a transparent substrate such as a glass substrate may be used as the substrate. The precursor solution may be coated on the substrate using a spin coating process. The spin coating process may be performed by loading a substrate on a chuck of a spin coater, supplying a sol solution (e.g., the precursor solution) onto the substrate, and rotating the substrate with the chuck to form a uniform and thin film on the substrate. That is, the spin coating process utilizes a centrifugal force, thereby more readily controlling a thickness of the film. In some embodiments, the precursor solution may be coated using different processes from the spin coating process. For example, the precursor solution may be coated using a dip coating process, a spray coating process, ink-jet process or any suitable solution process.

The step of soft baking the coated precursor solution (S130) may include heating the substrate to a temperature of about 50 degrees Celsius to about 300 degrees Celsius. The soft baking step (S130) may remove solvent in the coated precursor solution. Thus, the soft baking step (S130) may transform the coated precursor solution into a gelled precursor layer. The soft baking step (S130) may be performed using various methods. For example, the soft baking step (S130) may be performed using a hot plate, a furnace, or a laser.

The step of hard baking the substrate (S140) may include heating the substrate to a temperature of about 300 degrees Celsius to about 500 degrees Celsius. The hard baking step (S140) may remove additives and/or organic materials existing in the soft baked precursor solution. Accordingly, the hard baking step (S140) may transform the soft baked precursor solution into an oxide material layer. The hard baking step (S140) may be performed using various methods. For example, the hard baking step (S140) may be performed using a hot plate, a furnace, or a laser.

The heating temperature of the soft baking step (S130) and/or the hard baking step (S140) may vary according to the material or property of the precursor solution.

The step of supplying the photo energy (S150) will now be described. The step (S150) may supply additional energy to the substrate in addition to the thermal energy supplied by the soft baking step (S130) and/or the hard baking step (S140). The step (S150) and the hard baking step (140) may be simultaneously performed. That is, the additional energy may be supplied to the substrate while the hard baking step (S140) is performed. In an exemplary embodiment, the additional energy may include photo energy. In this case, the photo energy may be higher than the bonding energy of the precursor material.

In the step (S150), the photo energy may be supplied by irradiating a light generated from a light source onto the initial precursor solution or the baked precursor solution. In an exemplary embodiment, the light used in the step (S150) may have a wave length of ultraviolet rays. For example, the light irradiated onto the precursor solution in the step (S150) may have an intensity of about 2 mW/$cm^2$ to about 20 mW/$cm^2$. The light may be irradiated for about 10 minutes to about 10 hours. The photo energy may vary according to the intensity and the irradiation time of the light. Thus, the photo energy may be controlled by appropriately adjusting the intensity and the irradiation time of the light. Further, the step (S150) may be repeatedly performed two or more times.

The step of supplying the photo energy (S150) may be performed after at least one of the steps (S110, S120, S130 and S140) is conducted.

In some exemplary embodiments, an oxide material layer may be formed by sequentially performing the steps of mixing a precursor material with a peroxide material to form a precursor solution (S110), coating the precursor solution on a substrate (S120), soft baking the coated precursor solution to form a gelled precursor material (S130), supplying a photo energy to the substrate (S150), and hard baking the gelled precursor material (140). In some exemplary embodiments, an oxide material layer may be formed by sequentially performing the steps (S110, S150, S120, S130 and S140). In some exemplary embodiments, an oxide material layer may be formed by sequentially performing the steps (S110, S120, S150, S130 and S140). In some exemplary embodiments, an oxide material layer may be formed by sequentially performing the steps (S110, S120, S130, S140 and S150).

Alternatively, an oxide material layer may be formed by sequentially performing the steps of mixing a precursor material with a peroxide material to form a precursor solution (S110), supplying a photo energy to the substrate (S150), coating the precursor solution on the substrate (S120), supplying a photo energy to the substrate (S150), soft baking the coated precursor solution to form a gelled precursor material (S130), supplying a photo energy to the substrate (S150), hard baking the gelled precursor material (140), and supplying a photo energy to the substrate (S150).

The photo energy supplied in the step (S150) may accelerate decomposition of the precursor material and/or the peroxide material contained in the precursor solution. Further, the photo energy generated from the step (S150) may increase the number of defects in the oxide material layer. That is, the photo energy generated from the step (S150) may increase a carrier concentration of the oxide material layer. Specifically, chemical bonds of a metal organic compound material in the precursor solution may be more readily broken by the photo energy of the light irradiated onto the precursor solution. That is, a decomposition efficiency of the precursor material and/or the peroxide material when both the baking steps and the photo energy supply step are used to cure the precursor solution may be higher than that when only the baking steps are used to cure the precursor solution. For example, in the event that the oxide material layer is formed using a metal oxide material, chemical bonds between metal and oxygen in the oxide material layer may be more readily broken by the photo energy to generate point defects such as oxygen vacancies and/or interstitial defects. Accordingly, if the photo energy supply step is used in formation of the oxide material layer, the carrier concentration in the oxide material layer may be relatively more increased.

Moreover, if the photo energy is supplied to the precursor solution, the peroxide material in the precursor solution may be more sufficiently decomposed to increase the amount of oxygen in the precursor solution. As a result, the photo energy may accelerate a chemical reaction that the precursor solution is transformed into a metal oxide material.

The methods of forming the oxide material layers according to the above embodiments may be utilized for manufacturing oxide semiconductor layers, oxide conductive layers or oxide insulation layers. The oxide semiconductor layers may be used as channel layers of thin film transistors. The oxide conductive layers may be used as gate electrodes, source electrodes and/or drain electrodes of thin film transistors. The oxide insulation layers may be used as gate insulation layers of thin film transistors. The oxide semiconductor layers, the oxide conductive layers or the oxide insulation layers can be formed by adjusting the concentration of the peroxide material contained in the precursor solution and/or the amount of the photo energy supplied to the substrate. Methods of forming an oxide semiconductor layer according to the some embodiments and methods of fabricating a thin film transistor using the same will be described hereinafter.

First Embodiment

FIGS. 2 to 5 are cross sectional views illustrating a method of fabricating an inverted staggered type thin film transistor according to an exemplary embodiment.

FIGS. 2 to 5 exemplarily illustrate a method of fabricating a thin film transistor having a bottom gate. The bottom gate type thin film transistor may be widely used as a switching element of an active matrix liquid crystal display (AMLCD). According to methods of fabricating the bottom gate type thin film transistor, the number of photo masks may be reduced and fabrication costs may also be reduced. However, the exemplary embodiments may not be limited to the methods of fabricating the bottom gate type thin film transistor. For example, the exemplary embodiments may be applied to methods of fabricating various structural thin film transistors, for example, a top gate type thin film transistor.

Referring to FIGS. 2 to 5, a bottom gate type thin film transistor may be fabricated by forming a gate electrode 510 on a substrate 500, forming a gate insulation layer 520 on the gate electrode 510, forming a channel layer 530 on the gate insulation layer 520, and forming source/drain electrodes 540 and 550 on the channel layer 530.

The channel layer 530 was deposited using a method of forming an oxide material layer according to the above exemplary embodiments. Specifically, a precursor solution was coated on the gate insulation layer 520 (S120). The precursor solution was formed by mixing a precursor material with a peroxide material. The precursor material was a material that tin chloride (II) and zinc acetate are combined with each other, and the peroxide material was hydrogen peroxide ($H_2O_2$). The molar ration of tin chloride and zinc acetate was about 1:1. A volume ratio of the hydrogen peroxide ($H_2O_2$) to a solvent was 0.15:1. The substrate including the coated precursor solution was soft baked at a temperature of about 100 degrees Celsius for about one hour (S130). Subsequently, an ultraviolet ray having a wavelength of 185 nanometers and an intensity of 2 mW/cm$^2$ was irradiated onto the soft baked precursor solution (S150). The substrate was hard baked at a temperature of about 500 degrees Celsius for about two hours (S140) after the irradiation of the ultraviolet ray. As a result of the above processes, an oxide semiconductor layer was formed on the gate insulation layer 520. The oxide semiconductor layer acts as the channel layer 530 of the thin film transistor.

In the event that the concentration of the hydrogen peroxide increase and the amount of the photo energy supplied by the ultraviolet ray decrease in the above processes, an oxide insulation layer may be formed instead of the oxide semiconductor layer and the oxide insulation layer may be used as the gate insulation layer 520.

Figure 6:
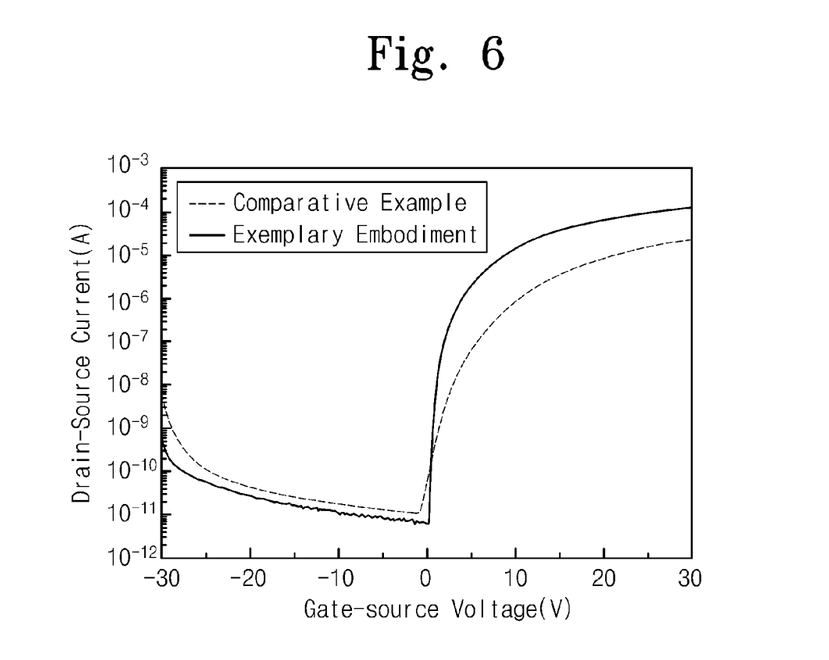
FIG. 6 is a graph illustrating a transfer curve of a thin film transistor fabricated using an oxide semiconductor layer according to an exemplary embodiment and a transfer curve of a thin film transistor fabricated using an oxide semiconductor layer according to a comparative example.

FIG. 6 is a graph illustrating a transfer curve of a thin film transistor fabricated using an oxide semiconductor layer according to the first embodiment and a transfer curve of a thin film transistor fabricated using an oxide semiconductor layer according to a comparative example. The thin film transistor exhibiting the transfer curve of the exemplary embodiment was fabricated using the process conditions described above. However, for the thin film transistor of comparative example, there were no addition of the hydrogen peroxide ($H_2O_2$) and no irradiation of ultraviolet ray for the purpose of comparison. The drain voltage was about 10.1V.

Referring to FIG. 6, an off-current flowing through the channel layer 530 of the thin film transistor fabricated according to the first embodiment was smaller than an off-current of the thin film transistor fabricated according to the comparative example. The off-current means a drain current that flows from the drain electrode 550 toward the source electrode 540 when a gate voltage applied to the gate electrode 510 is lower than a threshold voltage of the thin film transistor. In contrast, an on-current flowing through the channel layer 530 of the thin film transistor fabricated according to the exemplary embodiment was larger than an on-current of the thin film transistor fabricated according to the comparative example. The on-current means a drain current that flows from the drain electrode 550 toward the source electrode 540 when a gate voltage applied to the gate electrode 510 is higher than a threshold voltage of the thin film transistor. Further, a sub-threshold slope (e.g., a sub-threshold swing factor) of the thin film transistor fabricated according to the exemplary embodiment was more excellent than a sub-threshold slope of the thin film transistor fabricated according to the comparative example. The sub-threshold slope means a gate voltage that is required to increase the drain current by 10 times (e.g., one order) in the sub-threshold region.

Second Embodiment

For the purpose of simplification in explanation, the following description will focus on differences between the present embodiment and the previously described first embodiment. The same elements as described in the first embodiment are indicated by the same reference numerals or the same reference designators.

Figure 7:
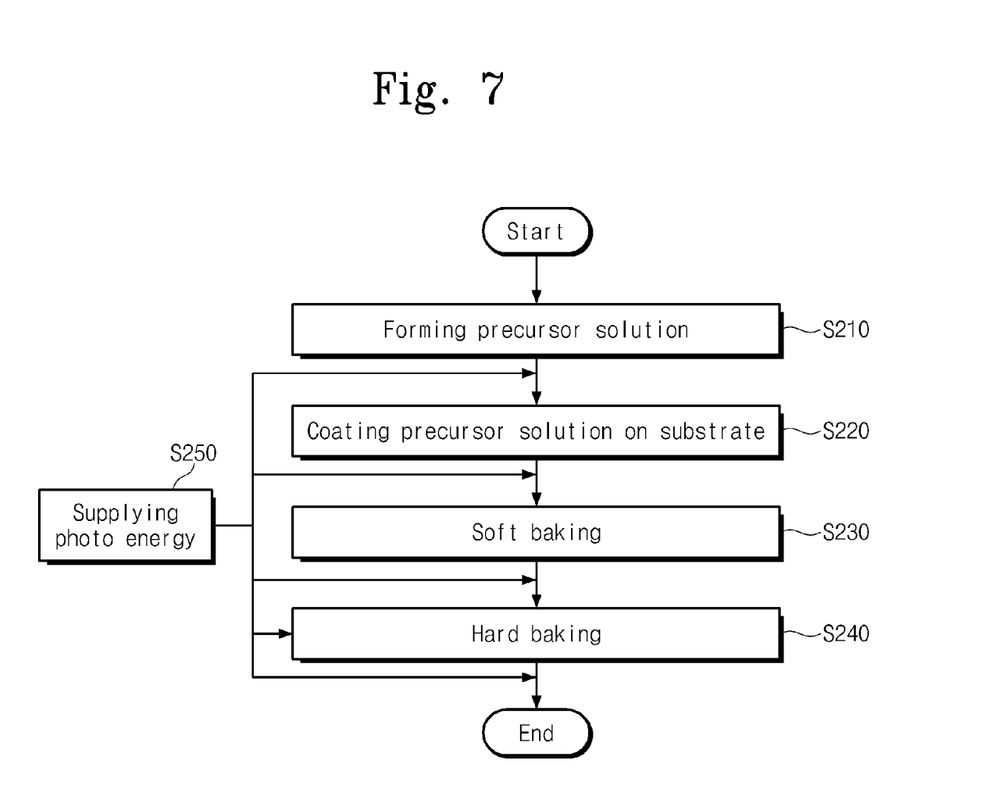
FIG. 7 is a process flow chart illustrating a method of forming an oxide material layer according to another exemplary embodiment.

FIG. 7 is a process flow chart illustrating a method of forming an oxide material layer according to another exemplary embodiment.

As illustrated in FIG. 7, a method of forming an oxide material layer according to the second embodiment may include steps of forming a precursor solution (S210), coating the precursor solution on a substrate (S220), soft baking the coated precursor solution (S230), hard baking the soft baked precursor solution (S240) and supplying photo energy (S250). One of differences between the second embodiment and the first embodiment is that the precursor solution is formed without use of peroxide material in the step (S210). That is, according to the second embodiment, an oxide conductive layer can be formed. The oxide conductive layer formed according to the second embodiment may be used as the gate electrode (510 of FIGS. 2 to 5), the source electrode (540 of FIG. 5) and/or the drain electrode (550 of FIG. 5).

The following descriptions will be developed in conjunction with processes for forming the gate electrode using the oxide conductive layer. Referring to FIG. 7, a precursor solution was coated on a substrate 500 (S220). The precursor solution was formed using a precursor material without use of a peroxide material (S210). The precursor material was a material that tin chloride (II) and zinc acetate are combined with each other. The substrate including the coated precursor solution was soft baked at a temperature of about 300 degrees Celsius for about five minutes (S230). Subsequently, the substrate was hard baked at a temperature of about 500 degrees Celsius for about two hours to form an oxide material layer (S240). An ultraviolet ray having a wavelength of 185 nanometers and an intensity of 2 mW/cm$^2$ was irradiated onto the oxide material layer (S250). As a result of the above processes, an oxide conductive layer was formed on the substrate 500. The oxide conductive layer can be used as the gate electrode 510 of the thin film transistor.

Figure 8:
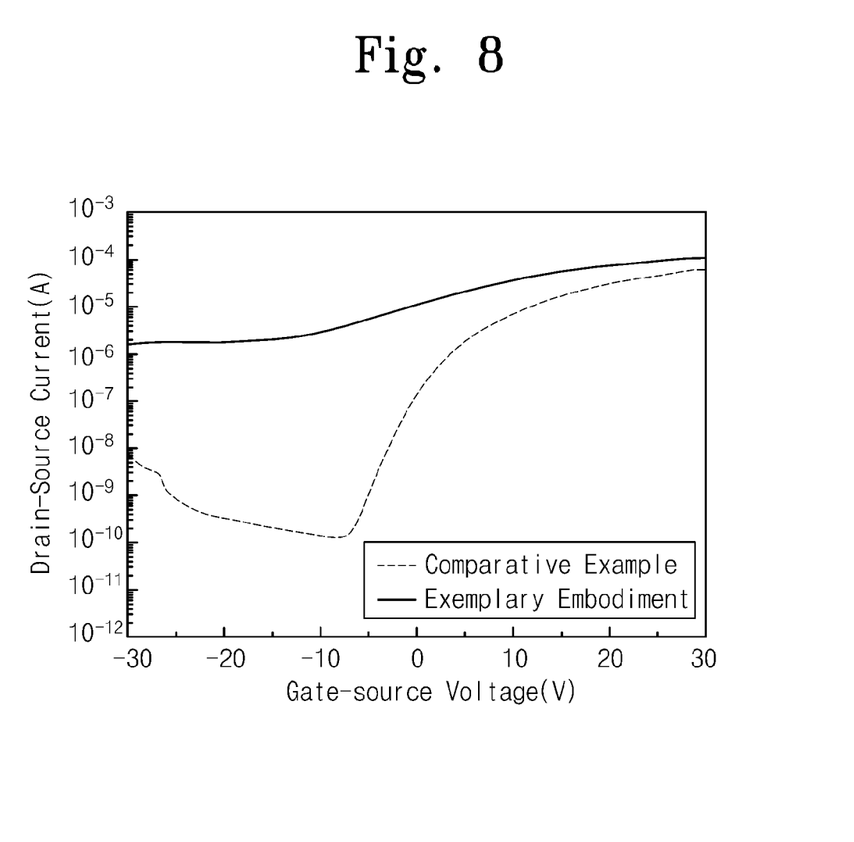
FIG. 8 is a graph illustrating a transfer curve of a thin film transistor fabricated using an oxide conductive layer according to another exemplary embodiment as a channel layer and a transfer curve of a thin film transistor fabricated according to another comparative example.

FIG. 8 is a graph illustrating a transfer curve of a thin film transistor fabricated using an oxide conductive layer according to the second embodiment as a channel layer and a transfer curve of a thin film transistor fabricated according to another comparative example. However, for the thin film transistor of comparative example, there were no addition of the hydrogen peroxide ($H_2O_2$) and no irradiation of ultraviolet ray for the purpose of comparison. The molar ration of tin chloride and zinc acetate was about 4:1~3:1. The drain voltage was about 10.1V.

Referring to FIG. 8, the thin film transistor fabricated according to the comparative example still exhibited a switching characteristic of a typical transistor. In contrast, the thin film transistor according to the second embodiment exhibited a large current over about one microampere even though a gate voltage lower than a threshold voltage was applied to the gate electrode. Thus, it will be appreciated that the oxide conductive layer according to the second embodiment can be used as a typical conductive layer operating under the Ohm's law.

As described above, oxide semiconductor layers and oxide conductive layers can be formed using the exemplary embodiments, and the oxide semiconductor layers and the oxide conductive layers can be used as the channel layers and the gate electrodes (or the source/drain electrodes) of the thin film transistors respectively. However, the inventive concept is not limited to the above descriptions. That is, both the oxide semiconductor layers and the oxide conductive layers can be formed using the first embodiment or the second embodiment. Further, oxide insulation layers may be formed using some exemplary embodiments of the inventive concept.

Specifically, according to an exemplary embodiment, the electrical characteristics of the oxide material layers can be controlled by adjusting the amount of the photo energy supplied during formation of the oxide material layers and/or by adjusting the concentration of the hydrogen peroxide in the precursor solution for forming the oxide material layers. For example, in the event that the concentration of the hydrogen peroxide increases and the amount of the photo energy decreases, the oxide material layers can be formed to have the properties of the insulation layers. Alternatively, in the event that the concentration of the hydrogen peroxide decreases and the amount of the photo energy increases, the oxide material layers can be formed to have the properties of the semiconductor layers or the conductive layers.

Figure 9:
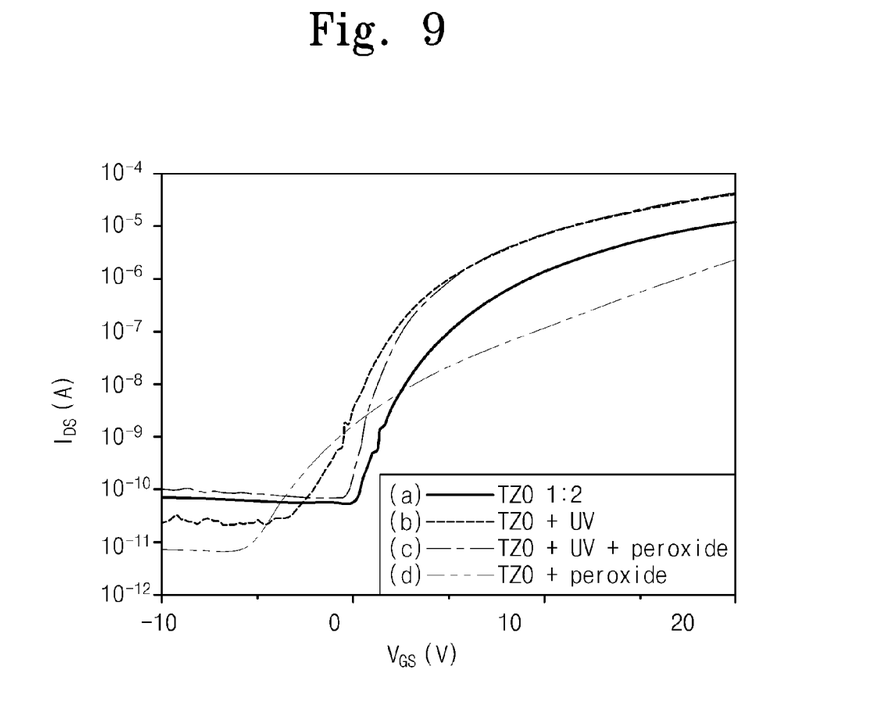
FIG. 9 is a graph illustrating I-V characteristics of thin film transistors fabricated using oxide semiconductor layers according to some exemplary embodiments.

FIG. 9 is a graph illustrating electrical characteristics (e.g., transfer curves) of thin film transistors fabricated using oxide semiconductor layers according to some exemplary embodiments as channel layers.

Referring to FIG. 9, the oxide semiconductor layers employed in all of the thin film transistors were formed using a precursor material formed by combining tin chloride (II) with zinc acetate with molar ration of about 1:2. The drain voltage was about 10.1V. Specifically, the curve (a) indicates a transfer characteristic of a thin film transistor fabricated using a typical solution process without addition of peroxide and supply of photo energy and the curve (b) indicates a transfer characteristic of a thin film transistor fabricated using the step of supplying the photo energy. Further, the curve (c) indicates a transfer characteristic of a thin film transistor fabricated using a precursor solution formed by mixing a precursor material with a peroxide material and using the step of supplying the photo energy, and the curve (d) indicates a transfer characteristic of a thin film transistor fabricated using a precursor solution formed by mixing a precursor material with a peroxide material without use of the step of supplying the photo energy. In FIG. 9, the legend "TZO" means a tin zinc oxide material used as a precursor material.

As can be seen from the electrical characteristics shown in FIG. 9, the on-current of the thin film transistor indicated by the curve (b) was about 10 times greater than that of the thin film transistor indicated by the curve (a). However, the sub-threshold slope (e.g., the sub-threshold swing factor) of the thin film transistor indicated by the curve (b) was degraded as compared with the sub-threshold slope of the thin film transistor indicated by the curve (a). This may be understood to mean that the photo energy generates oxygen vacancies in the oxide semiconductor layer of the thin film transistor and the oxygen vacancies increases the potential of defects in the oxide semiconductor layer.

Further, referring still to FIG. 9, the on-current of the thin film transistor indicated by the curve (c) was substantially equal to that of the thin film transistor indicated by the curve (b), and the sub-threshold slope (e.g., the sub-threshold swing factor) of the thin film transistor indicated by the curve (c) was improved as compared with the sub-threshold slope of the thin film transistor indicated by the curve (a). This may be understood to mean that the photo energy generates additional carriers (e.g., electrons) in the oxide semiconductor layer and the peroxide material decreases defects in oxide semiconductor layer affecting the sub-threshold slope of the thin film transistor.

According to the embodiments of the inventive concept discussed above, electrical characteristics of oxide material layers can be controlled by adjusting the amount of the photo energy supplied during formation of the oxide material layers and/or by adjusting the concentration of the hydrogen peroxide in the precursor solution for forming the oxide material layers.

Further, according to the exemplary embodiments, the oxide material layer can be formed at a low temperature.

Moreover, according to the exemplary embodiments, film quality of the oxide material layer can be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of forming an oxide material layer, comprising:
   (a) mixing a precursor material with a peroxide material to form a precursor solution;
   (b) coating the precursor solution on a substrate; and
   (c) baking the coated precursor solution.

2. A method of forming an oxide material layer, comprising:
   (a) mixing a precursor material with a peroxide material to form a precursor solution;
   (b) coating the precursor solution on a substrate; and
   (c) baking the coated precursor solution, wherein the baking step includes:
   (d) soft baking the substrate to remove solvent in the coated precursor solution after the step (b); and
   (e) hard baking the substrate to form an oxide material layer.

3. The method of forming an oxide material layer according to claim 2, further comprising:
   supplying photo energy to the substrate after at least one step among the steps (a), (b), (d) and (e).

4. The method of forming an oxide material layer according to claim 3, wherein the supplying step is repeatedly performed two or more times.

5. The method of forming an oxide material layer according to claim 3, wherein the supplying step is performed for about 10 minutes to about 10 hours.

6. The method of forming an oxide material layer according to claim 3, wherein the supplying step includes irradiating a light having energy that is higher than bonding energy of the precursor material.

7. The method of forming an oxide material layer according to claim 3, wherein the supplying step includes irradiating a light having an intensity of about 2 $mW/cm^2$ to about 20 $mW/cm^2$.

8. The method of forming an oxide material layer according to claim 1, wherein the peroxide material is selected from the group consisting of hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP).

9. The method of forming an oxide material layer according to claim 1, wherein the precursor material is formed by combining at least one metal selected from the group consisting of tin (Sn), zinc (Zn), indium (In), gallium (Ga), thallium (Tl), zirconium (Zr), yttrium (Y), hafnium (Hf), aluminum (Al), magnesium (Mg) and nickel (Ni) with at least one of citrate, acetate, acetylacetonate, acrylate, chloride, nitrate, fluoride, methoxide, ethoxide, propoxide and butoxide.

10. The method of forming an oxide material layer according to claim 1, wherein the precursor material and the peroxide material are mixed in a weight ratio of 1:0.1 to 1:3.

11. A method of forming an oxide material layer, comprising:
    (a) forming a precursor solution;
    (b) coating the precursor solution on a substrate;
    (d) soft baking the substrate to remove solvent in the coated precursor solution;
    (e) hard baking the substrate after the step (d) to form an oxide material layer; and
    (f) supplying photo energy to the substrate after at least one step among the steps (a), (b), (d) and (e).

12. A method of forming an oxide material layer, comprising:
    coating a precursor solution on a substrate, the precursor solution being formed by mixing a precursor material with a peroxide material; and
    supplying photo energy to the substrate on which the precursor solution is coated.

13. A composition used in formation of an oxide material layer, comprising:
    a precursor material; and
    a peroxide material.

14. The composition used in formation of an oxide material layer according to claim 13, wherein the peroxide material is selected from the group consisting of hydrogen peroxide ($H_2O_2$), acetone peroxide ($C_6H_{12}O_4$), 1,2,4-trioxane ($C_3H_6O_3$), benzoyl peroxide ($C_{14}H_{10}O_4$) and methyl-ethyl-ketone-peroxide (MEKP).

15. The composition used in formation of an oxide material layer according to claim 13, wherein a weight ratio of the precursor material to the peroxide material is 1:0.1 to 1:3.

* * * * *